US007872293B2

(12) United States Patent
Komura

(10) Patent No.: US 7,872,293 B2
(45) Date of Patent: Jan. 18, 2011

(54) CAPACITANCE CELL, SEMICONDUCTOR DEVICE, AND CAPACITANCE CELL ARRANGING METHOD

(75) Inventor: Kazufumi Komura, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 582 days.

(21) Appl. No.: 11/482,012

(22) Filed: Jul. 7, 2006

(65) Prior Publication Data
US 2007/0187740 A1    Aug. 16, 2007

(30) Foreign Application Priority Data
Feb. 14, 2006    (JP)    ............... 2006-036376

(51) Int. Cl.
H01L 29/94    (2006.01)
(52) U.S. Cl. .................. 257/308; 257/306; 257/307; 257/309; 257/E29.343
(58) Field of Classification Search ................ 257/306, 257/758, 307, 308, 309, E29.343; 361/792
See application file for complete search history.

(56) References Cited

U.S. PATENT DOCUMENTS

| | | | | |
|---|---|---|---|---|
| 7,276,776 | B2 * | 10/2007 | Okuda et al. ................ | 257/532 |
| 2003/0161128 | A1 * | 8/2003 | Masuda ....................... | 361/792 |
| 2003/0206389 | A1 * | 11/2003 | Hajimiri et al. .......... | 361/306.1 |
| 2005/0268445 | A1 * | 12/2005 | Gallay et al. ................ | 29/25.41 |

FOREIGN PATENT DOCUMENTS

| JP | 2001-177056 A | 6/2001 |
|---|---|---|
| JP | 2003-249559 A | 9/2003 |
| JP | 2004-241762 A | 8/2004 |

* cited by examiner

*Primary Examiner*—Eugene Lee
(74) *Attorney, Agent, or Firm*—Westerman, Hattori, Daniels & Adrian, LLP

(57) ABSTRACT

A capacitance cell 21 is wired while using adjacent wiring layers Ma and Mb as a pair of electrode layers T1 and T2 orthogonally to opposed lateral end faces out of lateral end faces X1, X2, Y1, and Y2 that section the cell in a plane direction. Contact surfaces of electrode surfaces T1 and T2 with the lateral end faces are second connection terminals T12 and T22. For longitudinal pathways, first and second via contact layers V1 and V2are connected. The first via contact layer V1 interconnects the wiring layers Ma and Mb. The second via contact layer V2 is connected to a wiring layer located outside beyond an upper or lower end face Z2, Z1. The second via contact layer V2 is connected to a first connection terminal T11, T21 located on the upper or lower end faces Z2, Z1. The capacitance cells 21 are linked via the first and second connection terminals so that a capacitance element having a free shape is formed. A capacitance cell, a semiconductor device, and a capacitance element arranging method that allow to arrange capacitance elements each using wiring layers sandwiching an interlayer insulating film with less of a leak current as electrode layers according to the shapes of unused areas.

15 Claims, 9 Drawing Sheets

PERSPECTIVE VIEW SHOWING CAPACITANCE CELL

FIG. 1
WIRING LAYOUT OF SEMICONDUCTOR DEVICE
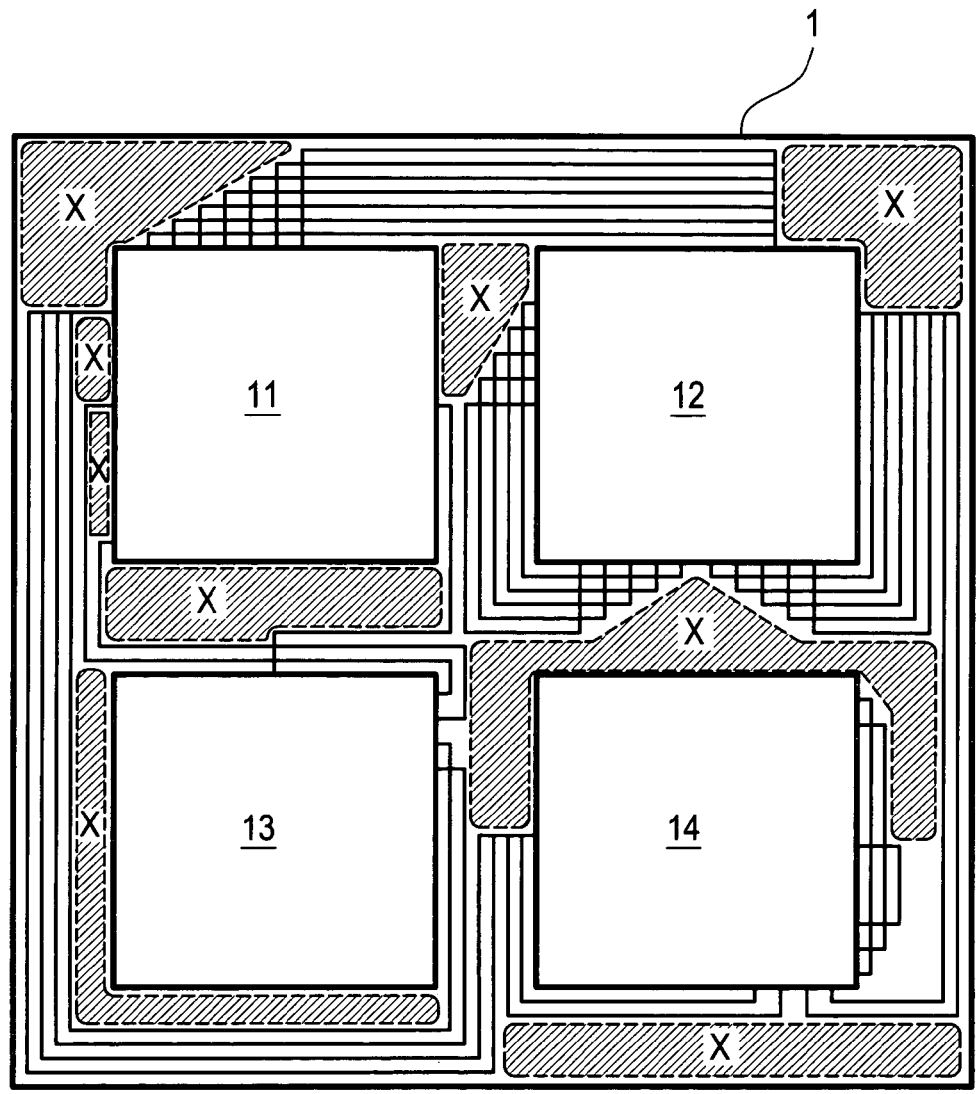
 : NON-WIRED AREA

FIG. 2
PERSPECTIVE VIEW SHOWING CAPACITANCE CELL
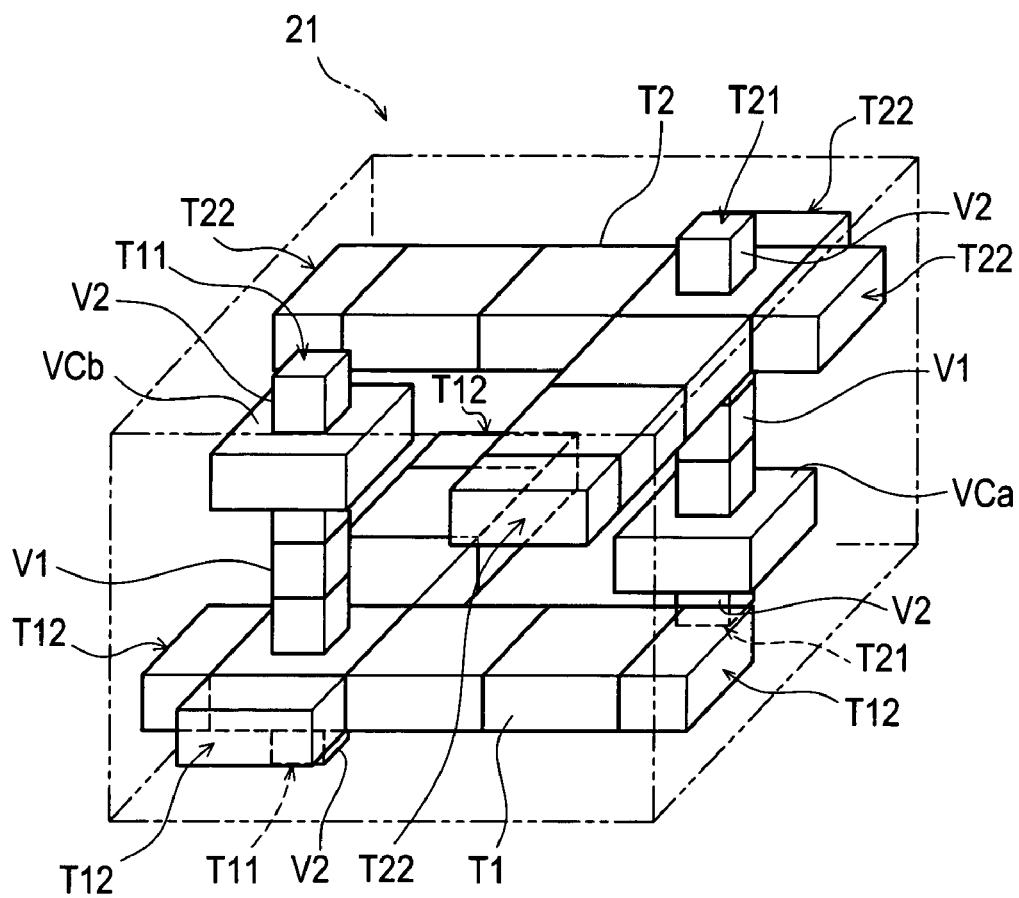
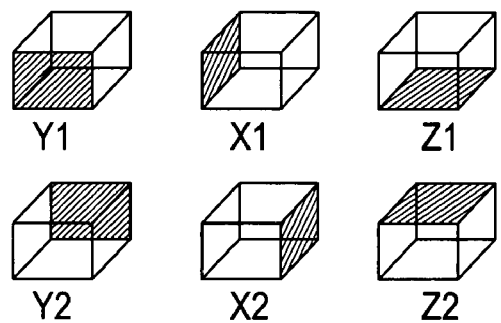

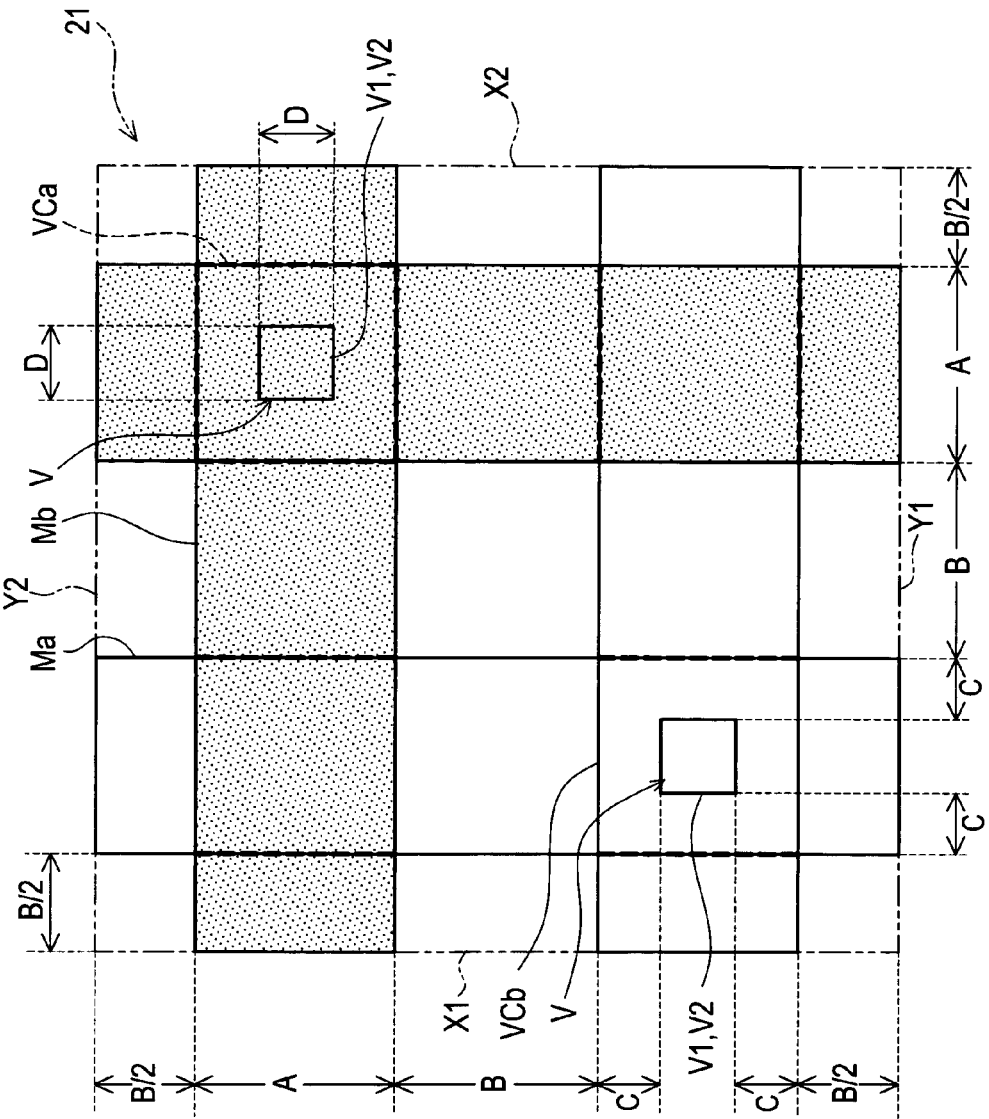
FIG. 3 PLAN VIEW SHOWING CAPACITANCE CELL

RELATIONSHIPS OF CONNECTION BETWEEN WIRING LAYERS AND VIA CONTACT LAYERS (A)  (B)

VIEW SHOWING LINKED CONDITION OF CAPACITANCE CELLS

VIEW SHOWING CAPACITANCE ELEMENT FORMED OF CAPACITANCE CELLS TWO-DIMENSIONALLY LINKED

VIEW SHOWING CAPACITANCE ELEMENT FORMED OF CAPACITANCE CELLS THREE-DIMENSIONALLY LINKED

VIEW SHOWING THAT CAPACITANCE ELEMENT IS FORMED IN FREE THREE-DIMENSIONAL SHAPE

MODIFICATION OF CAPACITANCE CELL

CAPACITANCE CELL, SEMICONDUCTOR DEVICE, AND CAPACITANCE CELL ARRANGING METHOD

CROSS-REFERENCE TO RELATED APPLICATIONS

This application is based upon and claims the benefit of priority from the prior Japanese Patent Application No. 2006-036376 filed on Feb. 14, 2006, the entire contents of which are incorporated herein by reference.

BACKGROUND OF THE INVENTION

1. Field of the Invention

The present invention relates to a capacitance cell, a semiconductor device, and a capacitance element arranging method when forming a capacitance element by use of multilayer wiring, and, more particularly to a capacitance cell, a semiconductor device, and a capacitance element arranging method that are capable of effectively arranging capacitance elements in non-wired areas on-a semiconductor device.

2. Description of Related Art

A capacitance element such as a decoupling capacitance provided for removing power supply noise has been formed by use of gate oxide films of MOS transistors when being formed inside of a semiconductor element. However, in recent years, owing to miniaturization of processing technologies, influence of a gate leak current can no longer be ignored. When a decoupling capacitance is formed of a capacitance element using a gate oxide film, increase in standby current is unavoidable in actual circumstances.

Therefore, in micro-processing, in place of capacitance elements using gate oxide films, capacitance elements each formed of a pair of wiring layers and an interlayer insulating film with less of a leak current sandwiched between the wiring layers have been proposed in various modes. Japanese unexamined patent publication No. 2003-249559 and Japanese unexamined patent publication No. 2004-241762 are examples of these.

In a multilayer wiring apparatus disclosed in Japanese unexamined patent publication No. 2003-249559, a plurality of wiring layers having a plurality of wirings each arrayed with pitches in an identical direction laminated so that pitch-arraying directions thereof mutually cross are provided, and these wiring layers are connected to each other in a longitudinal direction via a plurality of contact portions. Different first and second potentials are thereby supplied to adjacent wirings, respectively, to form a capacitance element. In addition, by releasing supply of the first and second potentials by eliminating the contact portions, signal lines can be passed in a crossing manner in a capacitance wiring area.

In a semiconductor device disclosed in Japanese unexamined patent publication No. 2004-241762, a plurality of wiring layers laminated to each other are provided, and each wiring layer includes an interlayer insulating film, first and second electrodes buried in this interlayer insulating film and separated from each other, first vias that connect the first electrodes and first electrodes of the wiring layer provided as an upper or lower layer thereof to each other, and second vias that connect the second electrodes and second electrodes of the wiring layer provided as an upper or lower layer thereof to each other, the first electrodes and the first vias are connected to a first terminal, the second electrodes and the second vias are connected to a second terminal, and a capacitor is formed between the first electrodes and the first vias and second electrodes and the second vias.

In addition, Japanese unexamined patent publication No. 2001-177056 can be mentioned as another related art.

SUMMARY OF THE INVENTION

In the above publication No. 2003-249559, indeed signal lines can be passed in a crossing manner in a capacitance wiring area if necessary. However, it is necessary to provide a plurality of wiring layers having a plurality of wirings each arrayed with pitches in an identical direction laminated so that pitch-arraying directions thereof mutually cross so as to secure a capacitance wiring area separate from a signal wiring area, and no concept to form a capacitance element by making effective use of a vacant area caused by signal wiring has been disclosed. A large wiring area must be secured for a capacitance element, and this may restrict wiring of signal lines. In addition, a vacant area in the signal wiring area where signal lines are wired cannot be allocated to a capacitance element in some cases, which poses a problem as this may restrict high integration.

Moreover, in the above publication No. 2004-241762, by forming the first and second electrodes into a longitudinally laminated structure via the first and second vias, indeed the capacitance value per unit area of a capacitor is increased. However, there is no description of a structure to develop the capacitor with an increased capacitance value per unit area in a plane direction. In order to make effective use of vacant areas in various shapes that remain as non-wired areas as a result of a signal wiring arrangement, when capacitors are arranged in the same areas, it is necessary to design capacitor shapes in accordance with the shapes of the non-wired areas, which is troublesome.

The present invention has been made in view of the above-described background arts, and it is an object of the invention to provide a capacitance cell, a semiconductor device, and a capacitance element arranging method that allow to arrange capacitance elements each formed of wiring layers sandwiching an interlayer insulating film with less of a leak current as electrode layers according to the shapes of unused areas.

To achieve the above object, according to a first aspect of the invention, there is provided a capacitance cell that uses wiring layers laminated in multiple layers as electrodes, comprising: a pair of electrode layers formed of a pair of wiring layers adjacently laminated; first connection terminals provided on an upper end face and a lower end face that section the cell in an upper and lower direction for each of the electrode layers and are connected to the electrode layers; and second connection terminals provided on four lateral end faces that section the cell in plane directions for each of the electrode layers and are connected to the electrode layers.

For the capacitance cell according to the first aspect of the present invention, when forming a capacitance cell that uses wiring layers laminated in multiple layers as electrode layers, a pair of electrode layers are formed of a pair of wiring layers adjacently laminated while using the upper end face and lower end face that section the cell in the upper and lower direction and the four lateral end faces that section the cell in the plane directions as interfaces, and each of the electrode layers is connected to the first connection terminals provided on the upper end face and lower end face and the second connection terminals on the lateral end faces.

Consequently, the capacitance cell includes the pair of electrode layers, and the first and second connection terminals connected to the respective electrode layers are provided on the upper and/or lower end faces and lateral end faces being interfaces between the capacitance cells, respectively. Therefore, the capacitance cells can be linked with each other at any end faces, and there can thus be formed a capacitance element of which element size, capacitance value, and the like can be increased/decreased in increments of the capacitance cell.

By setting the size of the capacitance cell to a size that can be arranged in the non-wired area remaining after signal wiring, irrespective of the size of the non-wired area caused by signal wiring and the shapes in the upper and lower and plane directions, the capacitance cells can be linked as necessary to form a capacitance element. A capacitance element can be arranged by making effective use of a vacant area with no signal wiring. It is unnecessary to secure a capacitance wiring area separate from a signal wiring area, which greatly contributes to high integration when arranging a capacitance element.

According to a second aspect of the invention, there is provided a semiconductor device comprising a capacitance element formed by linking at least two capacitance cells each comprising: a pair of electrode layers formed of a pair of wiring layers adjacently laminated; first connection terminals provided on an upper end face and a lower end face that section the cell in an upper and lower direction for each of the electrode layers and are connected to the electrode layers; and second connection terminals provided on four lateral end faces that section the cell in plane directions for each of the electrode layers and are connected to the electrode layers.

For the semiconductor device of the second aspect of the invention, when using an upper end face and a lower end face that section a cell in the upper and lower direction and four lateral end faces that sections the cell in the plane directions as interfaces, a capacitance element is formed by linking capacitance cells each of which comprises: first connection terminals provided on an upper end face and a lower end face that section the cell in an upper and lower direction for each of the electrode layers and are connected to the electrode layers; and second connection terminals provided on four lateral end faces.

Consequently, the capacitance cells each including, on the upper and/or lower end faces and lateral end faces, the first and second connection terminals to which the pair of electrode layers are respectively connected are linked with each other so that a capacitance element is formed. Therefore, there can be formed a capacitance element of which element size, capacitance value, and the like can be increased/decreased in increments of the capacitance cell.

Owing to the capacitance cells each set to a size that can be arranged in the non-wired area remaining after signal wiring, irrespective of the size of the non-wired area caused by signal wiring and the shapes in the upper and lower and plane directions of the non-wired area, the capacitance cells can be linked as necessary to form a capacitance element. A capacitance element can be arranged by making effective use of a vacant area with no signal wiring. In a semiconductor device, it is unnecessary to secure a capacitance wiring area separate from a signal wiring area, which greatly contributes to high integration when arranging a capacitance element.

According to a third aspect of the present invention, there is provided method for arranging a capacitance cell using wiring layers laminated in multiple layers as electrodes, the capacitance element arranging method comprising the steps of: preparing a capacitance cell that uses a pair of electrode layers formed of a pair of wiring layers adjacently laminated, that is sectioned in upper and lower and plane directions, and that can be connected from the outside to each of the electrode layers on respective end faces in the upper and lower and plane directions; and forming a capacitance element by linking at least two capacitance cells.

According to the third aspect of the invention, there is prepared a capacitance cell that uses a pair of electrode layers formed of a pair of wiring layers adjacently laminated, that is sectioned in upper and lower and plane directions, and that can be connected from the outside to each of the electrode layers on respective end faces in the upper and lower and plane directions, and then formed a capacitance element by linking at least two capacitance cells. A capacitance element is formed by linking at least two thus prepared capacitance cells.

Consequently, for the prepared capacitance cell, on the upper and/or lower end faces and lateral end faces, the pair of electrode layers can be respectively connected from the outside, therefore, the capacitance cells can be linked with each other at the respective end faces. There can be arranged a capacitance element of which element size, capacitance value, and the like can be increased/decreased in increments of the capacitance cell.

By preparing a capacitance cell in a size that can be arranged in the non-wired area remaining after signal wiring, irrespective of the size of the non-wired area caused by signal wiring and the shapes in the upper and lower and plane directions of the non-wired area, the capacitance cells can be linked as necessary to form a capacitance element. A capacitance element can be arranged by making effective use of a vacant area with no signal wiring. It is unnecessary to secure a capacitance wiring area separate from a signal wiring area, which greatly contributes to high integration when arranging a capacitance element.

The above and further objects and novel features of the invention will more fully appear from the following detailed description when the same is read in connection with the accompanying drawing it is to be understood, however, that the drawings are from the purpose of illustration only and are not intended as a definition of the limits of the invention.

BRIEF DESCRIPTION OF THE DRAWINGS

FIG. 1 is a view showing a wiring layout of a semiconductor device;

FIG. 2 is a perspective view showing a capacitance cell of an embodiment;

FIG. 3 is a plan view showing a capacitance cell of an embodiment;

DETAILED DESCRIPTION OF THE PREFERRED EMBODIMENTS

Figure 4A:
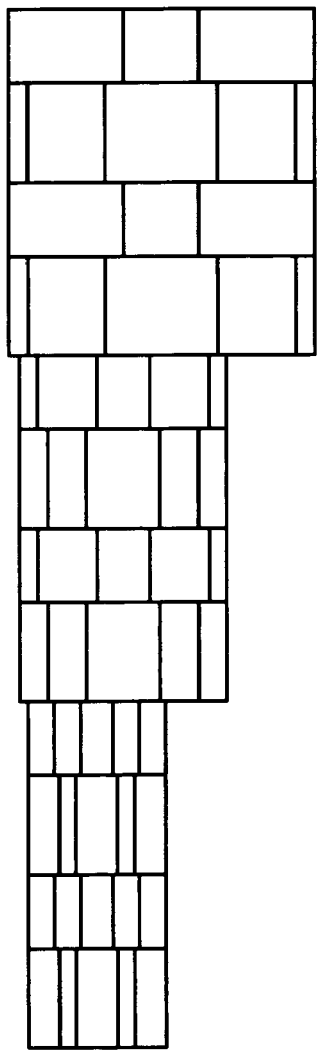
FIGS. 4A and 4B are conceptual diagrams showing the relationships of connection between wiring layers and via contact layers laminated in multiple layers.

Hereinafter, embodiments of a capacitance cell, a semiconductor device, and a capacitance element arranging method will be described in detail based on FIG. 1 to FIG. 9 with reference to the drawings.

FIG. 1 is a conceptual diagram showing a wiring layout of a semiconductor device 1. It shows circuit blocks 11 to 14 connected via signal wiring therebetween, provided that the circuit blocks 11 to 14 are arranged on the semiconductor device 1.

The types and number of signals inputted and outputted with respect to the respective circuit blocks 11 to 14 arranged on the semiconductor device 1 or signal connection terminal positions of the circuit blocks 11 to 14 or both vary according to the circuit blocks 11 to 14. Also, layout of the signal wiring is also different according to the arrangement positions of the circuit blocks 11 to 14.

While the signal wiring is to be laid out in areas that exist between the circuit blocks 11 to 14, circuit configurations and connection terminal positions of the signal wiring are unique to each of the circuit blocks, and layout positions of the circuit blocks 11 to 14 in the semiconductor device 1 can also be selected. Therefore, layout of the signal wiring to connect the arranged circuit blocks 11 to 14 therebetween is greatly dependent on the arranged circuit blocks 11 to 14 and arrangement positions thereof. In the areas between circuit blocks, areas with tight signal wiring and areas with loose signal wiring are mixed. Furthermore, according to required connection positions of the signal wiring, the areas between the circuit blocks are dotted with non-wired areas X where no signal wiring is laid out. The non-wired areas X exist in a dotted manner at random positions according to the signal wiring layout, and the respective non-wired areas X are also different in size.

Here, the non-wired areas X include not only areas where no signal wiring exists and laminated wiring layers have not been used as signal wiring but also areas where, although some wiring layers have been used as signal wiring, two or more consecutive wiring layers out of the laminated wiring layers have not been used as signal wiring. Thereby, wiring layers not used as signal wiring and adjacently laminated can be used as a pair to form a capacitance element.

A capacitance cell 21 is shown in FIG. 2 and FIG. 3. FIG. 2 shows a perspective view, and FIG. 3 shows a plan view. Design rules in layout are shown in the plan view of FIG. 3.

The capacitance cell 21 is formed while using adjacently laminated wiring layers Ma and Mb out of metal wiring layers laminated in multiple layers as a pair of electrode layers T1 and T2. The respective electrode layers T1 and T2 are wired with a line width A in a manner that the corresponding wiring layers Ma and Mb are orthogonal to, out of four lateral end faces X1, X2, Y1, and Y2 that section the same in plane directions, the opposed lateral end faces X1 and X2 and lateral end faces Y1 and Y2, respectively. In this case, the wiring layers Ma and Mb maintain a wiring interval B as an interval between the lines and are wired in a manner that cross areas between the wiring layers Ma and Mb wired orthogonally to the opposed lateral end faces X1 and X2 and lateral end faces Y1 and Y2 are diagonally positioned in the plan view shown in FIG. 3. Contact surfaces of the electrode surfaces T1 and T2 with the lateral end faces X1, X2, Y1, and Y2 are second connection terminals T12 and T22. In the capacitance cell 21, when the arrangement positions of the second connection terminals T12 and T22 are specified with a three-dimensional coordinate, the second connection terminals T12 and T22 are arranged at an identical plane coordinate on each pair of the opposed lateral end faces X1 and X2 and Y1 and Y2, respectively.

In the respective cross areas between the wiring layers Ma and Mb orthogonally wired, a first via contact layer V1 and a second via contact layer V2 having a line width D that form a longitudinal pathway are connected. At connection points between the via contact layer and wiring layer, an allowable connection distance from the first and second via contact layers V1 and V2 to the ends of the wiring layers Ma and Mb is equal to a line width C.

The first via contact layer V1 is a via contact layer that interconnects the wiring layer Ma and wiring layer Mb. This is provided from the wiring layer Ma,Mb to the wiring layer Mb,Ma paired therewith, and is connected to via connection layers VCb,VCa formed of the wiring layers Mb,Ma. Since the via connection layer VCa and VCb are also formed of the wiring layers Ma and Mb, these have a line width A, and at connection points, an allowable connection distance from the first via contact layer V1 to the ends is equal to a line width C.

The second via contact layer V2 is a via contact layer when connecting, from the wiring layer Ma beyond a lower end face Z1 or from the wiring layer Mb beyond an upper end face Z2, to a wiring layer (unillustrated) located outside of the capacitance cell 21. The second via contact layer V2 provided in the capacitance cell 21 is, since this is linked with the capacitance cell 21 in the upper or lower direction, connected to a first connection terminal T11,T21 with a length almost one second of the interlayer distance between the wiring layers. This is provided, from the wiring layer Ma forming the electrode layer T1 and via connection layer VCa, downward orthogonal to the lower end face Z1 or, from the wiring layer Mb forming the electrode layer T2 and via connection layer VCb, upward orthogonal to the upper end face Z2. At connection points, an allowable connection distance from the second via contact layer V2 to the ends of the via contact layers VCa and VCb is equal to a line width C. Contact surfaces of the second via contact layer V2 with the lower end face Z1 and upper end face Z2 are the first connection terminals T11 and T21. In the capacitance cell 21, when the arrangement positions of the first connection terminals T11 and T21 are specified with a three-dimensional coordinate, the first connection terminals T11 and T21 are arranged at an identical plane coordinate on the opposed lower end face Z1 and upper end face Z2, respectively. In addition, the second via contact layer V2 is arranged at the same positions as those of the first via contact layer V1 in a plan view. This is for being connected to the via connection layers VCa and VCb similar to the first via contact layer.

As shown in FIG. 3, a distance from the wiring layers Ma and Mb to the respective lateral end faces X1, X2, Y1, and Y2 is almost half of the wiring interval B. Therefore, when capacitance cells 21 are linked at the lateral end faces X1, X2, Y1, and Y2, an interlayer distance between the wiring layers Ma and Mb is equal to the wiring interval B.

Here, the line widths A, C, and D and wiring interval B are determined in accordance with the design rules provided for the respective wiring layers Ma and Mb and the first and second via contact layers V1 and V2. When the same design rules are applied between the wiring layers, the capacitance cell 21 can be formed in a smallest size by forming the same at minimum permissible values. By formation at the minimum permissible values, occupancy area of the capacitance cells is reduced so that these can be efficiently arranged in the non-wired areas X and the capacitance value per unit area can be increased. By efficiently arranging the capacitance cells in the remaining non-wired areas X, a capacitance element that has a large capacitance value with a small occupancy area can be formed.

On the other hand, when the design rules are different between the wiring layers, by forming the capacitance cell 21 at maximum values of a minimum permissible size of each of the wiring layers, even for the wiring layers with different design rules, the arrangement positions of via contact layers V34, V45, V56, V67, V78, and V89 can be aligned therebetween. The capacitance cells can be connected with an equal planar area in a depth direction of the laminated multilayer wiring layers.

Description will now be given of FIGS. 4A and 4B. For lowermost metal wiring layers M4 and M5 and via contact layers V34 and V45, design rules in layout are permitted up to minimum permissible values. For metal wiring layers M6 and M7 and via contact layers V56 and V67 laminated thereon, layout by design rules having minimum permissible values larger than those of the lowermost layers are permitted. For metal wiring layers M8 and M9 and via contact layers V78 and V89 further thereon, design rules with further larger minimum permissible values are permitted. When capacitance cells are each formed by two adjacent metal wiring layers, if the respective layers are laid out by use of design rules with minimum permissible values, pitches of the first connection terminals are not matched between the layers with different minimum permissible values, consequently, the capacitance cells cannot be linked in the longitudinal direction (in the case of FIG. 4A). Therefore, when the minimum permissible values are unified for those of the design rules of the uppermost layers that can be used as a capacitance element, the pitches of the first connection terminals between the layers can be unified, so that the capacitance cells can be linked in the longitudinal direction (in the case of FIG. 4B).

Figure 4B:
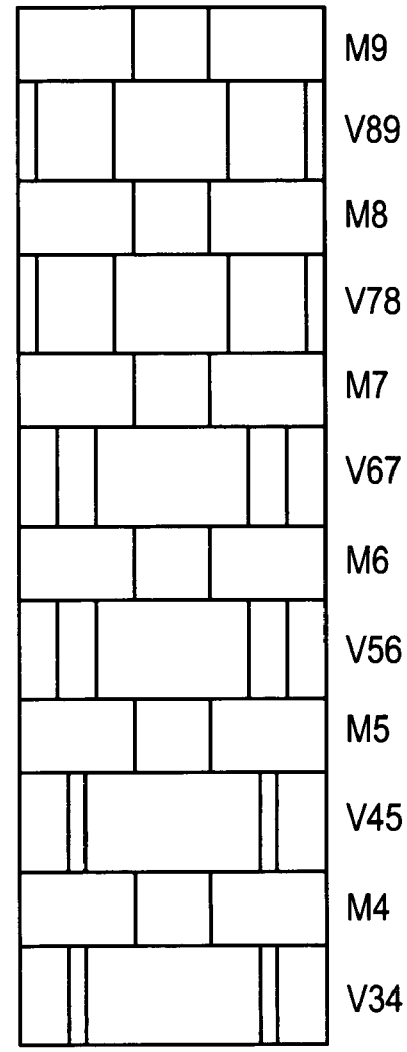

Here, with regard to FIGS. 4A and 4B, a description has been given of a case where the design rules of the minimum permissible values are different between every two adjacent metal wiring layers. However, identical design rules may be applied to four or more adjacent metal wiring layers. This is a case where identical design rules are applied to a plurality of metal wiring layers that can form two pairs or more of capacitance cells. In this case, it can also be considered to group metal wiring layers having identical design rules and form, group by group, a capacitance cell at minimum permissible values that comform to the corresponding design rules.

Figure 5:
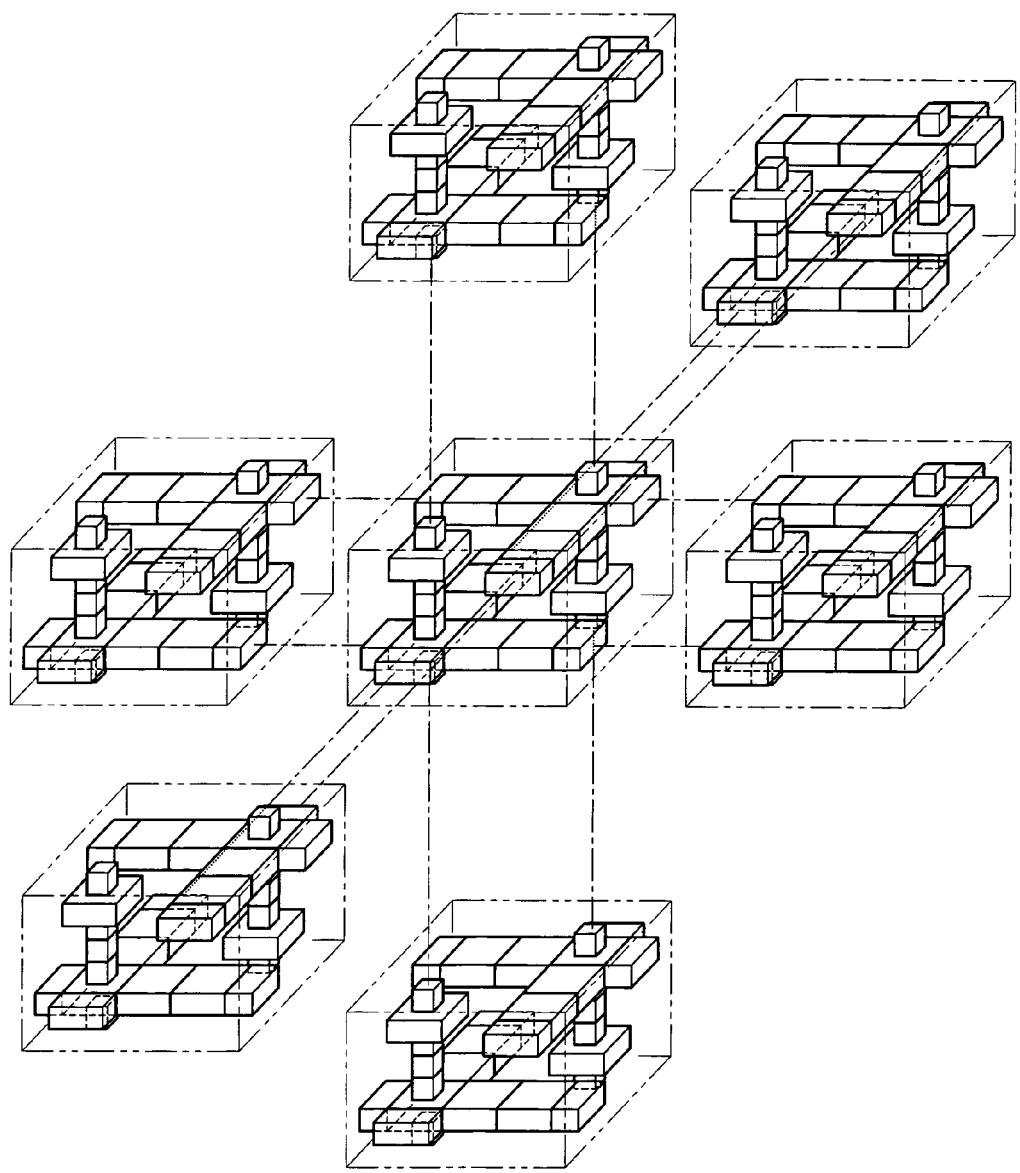
FIG. 5 is a view showing a linked condition of capacitance cells.

FIG. 5 is a view showing a linkage of the capacitance cells 21. Since the capacitance cells 21 are arranged with the first connection terminals T11 and T21 and the second connection terminals T12 and T22 at an identical plane coordinate on the opposed end faces for each pair of the electrode layers T1 and T2, by directly connecting two capacitance cells 21 in the same direction, the respective electrode layers T1 and T2 are linked.

When these are linked in the upper and lower direction, the lower end face Z1 and the upper end face Z2 are joined. The first connection terminal T11 of the lower end face Z1 and the first connection terminal T11 of the upper end face Z2 are linked, and the first connection terminal T21 of the lower end face Z1 and the first connection terminal T21 of the upper end face Z2 are linked.

When these are linked in the plane direction, the lateral end face X1 and lateral end face X2 and the lateral end face Y1 and lateral end face Y2 are joined. The second connection terminal T12 of the lateral end face X1 and the second connection terminal T12 of the lateral end face X2 are linked, and the second connection terminal T22 of the lateral end face X1 and the second connection terminal T22 of the lateral end face X2 are linked. In addition, the second connection terminal T12 of the lateral end face Y1 and the second connection terminal T12 of the lateral end face Y2 are linked, and the second connection terminal T22 of the lateral end face Y1 and the second connection terminal T22 of the lateral end face Y2 are linked.

Figure 6:
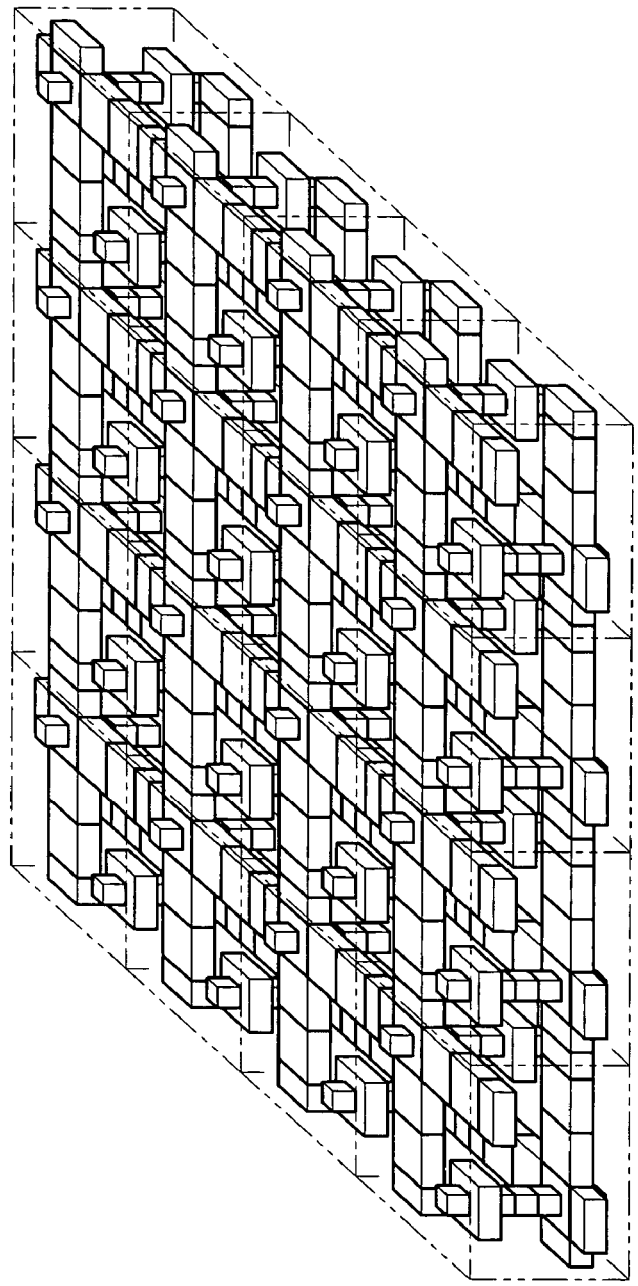
FIG. 6 is a view showing an example of a capacitance element formed of capacitance cells two-dimensionally linked.
Figure 7:
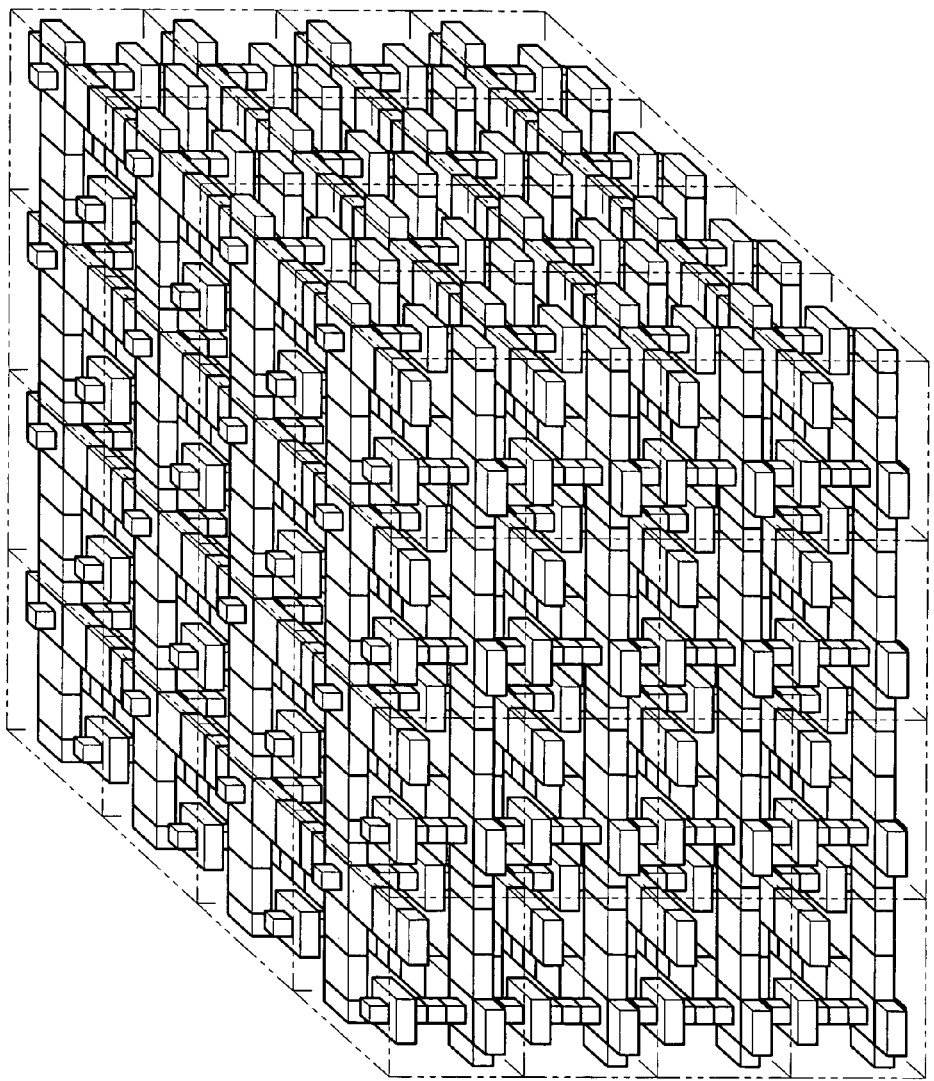
FIG. 7 is a view showing an example of a capacitance element formed of capacitance cells three-dimensionally linked.

Capacitance elements formed by linking the capacitance cells 21 are exemplified in FIG. 6 and FIG. 7. FIG. 6 shows a case where the capacitance cells are two-dimensionally linked. By linking the capacitance cells 21 between the lateral end face X1 and lateral end face X2 and between the lateral end face Y1 and lateral end face Y2, a four-by-four cell capacitance element is formed. In the capacitance cells 21, the distance between the lateral end faces X1, X2, Y1, and Y2 and end sides of the respective wiring layers Ma and Mb is provided at almost half (B/2) of the wiring interval B. Therefore, when the capacitance cells 21 are linked in the lateral direction, an interlayer distance between the wiring layers Ma and Mb between the adjacent capacitance cells is equal to the wiring interval B, which is a minimum permissible value by the design rules. Concretely, the electrode layer T1 surrounds the via connection layer VCa at a minimum permissible interval, and the electrode layer T2 surrounds the via connection layer VCb at a minimum permissible interval. In the upper and lower direction, a capacitance portion is formed between the electrode layers T1 and T2. Moreover, in the plane direction, the electrode layer T1 and via connection layer VCa and the electrode layer T2 and via connection layer VCb form capacitance portions at minimum permissible values, respectively, and this greatly contributes to increasing the capacitance value per unit area. When a capacitance element is formed by linking the capacitance cells 21, the capacitance value per unit area can thus be increased. A high-capacitance element can be efficiently formed.

FIG. 7 is a case where the capacitance cells are three-dimensionally linked. This has a structure where the capacitance element of FIG. 6 is linked in four tiers in the upper and lower direction. In the upper and lower direction, by the first and second via contact layers V1 and V2 that link adjacent capacitance cells 21, the respective electrode layers T1 and T2 are separately linked between the adjacent capacitance cells 21 so as to enclose the electrode layers paired therewith. The electrode layer T1 and the first and second via contact layers V1 and V2 enclose the electrode layer T2, and the electrode layer T2 and the first and second via contact layers V1 and V2 enclose the electrode layer T1. Thereby, in the upper and lower direction as well as the plane direction, the capacitance value per unit area can be greatly secured so that an efficient capacitance element can be formed.

Figure 8:
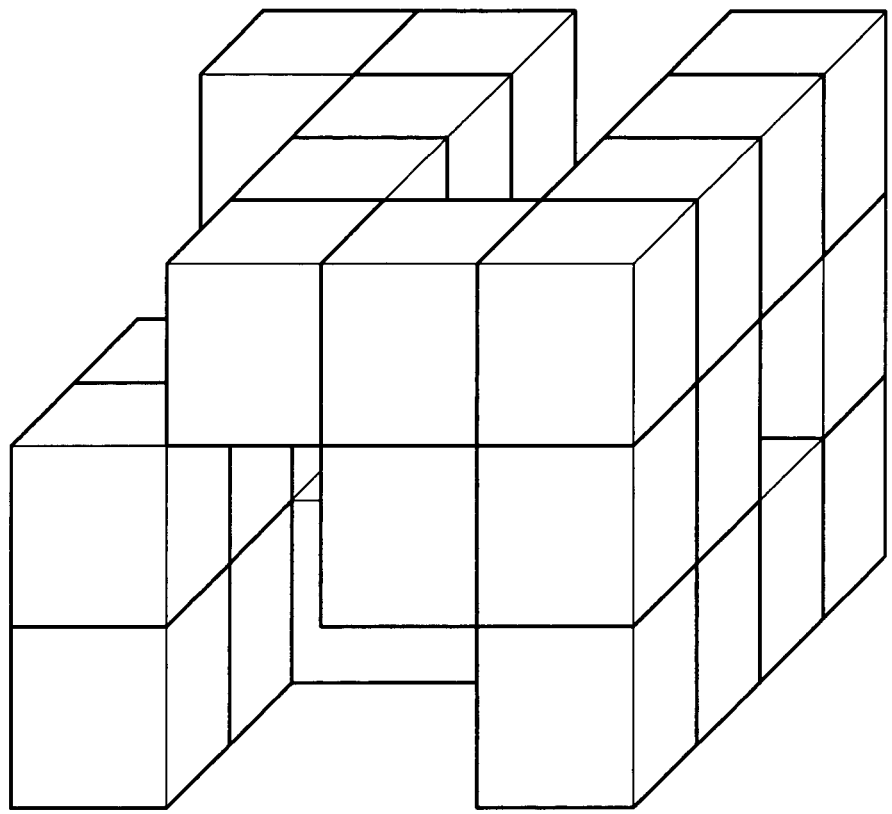
FIG. 8 is a view showing that a capacitance element is formed in a free three-dimensional shape.

FIG. 8 is a view schematically showing a case where a capacitance element is efficiently formed in the non-wired area X having an arbitrary shape shown in FIG. 1. The shape of the non-wired area X can be considered to have an arbitrary shape in the upper and lower direction as well as an arbitrary shape in the plane direction. This is because, in addition to a difference in the presence of the signal wiring in the plane direction, in a case of the semiconductor device 1 having a multilayer wiring structure, there is also a difference in the presence of the signal wiring in the upper and lower direction as well according to a difference in the wiring layers used for the signal wiring.

In order to effectively use the non-wired area X having an arbitrary shape three-dimensionally as an arrangement area for a capacitance element, the capacitance cells 21 can be utilized. Rectangular parallelepipeds in FIG. 8 show capacitance cells 21. The capacitance cells 21 can be freely linked in the upper and lower direction and plane direction. Thereby, the capacitance cells 21 can be linked in accordance with the three-dimensional shape of the non-wired area X, and consequently, a capacitance element effectively using the non-wired area X can be formed.

Figure 9:
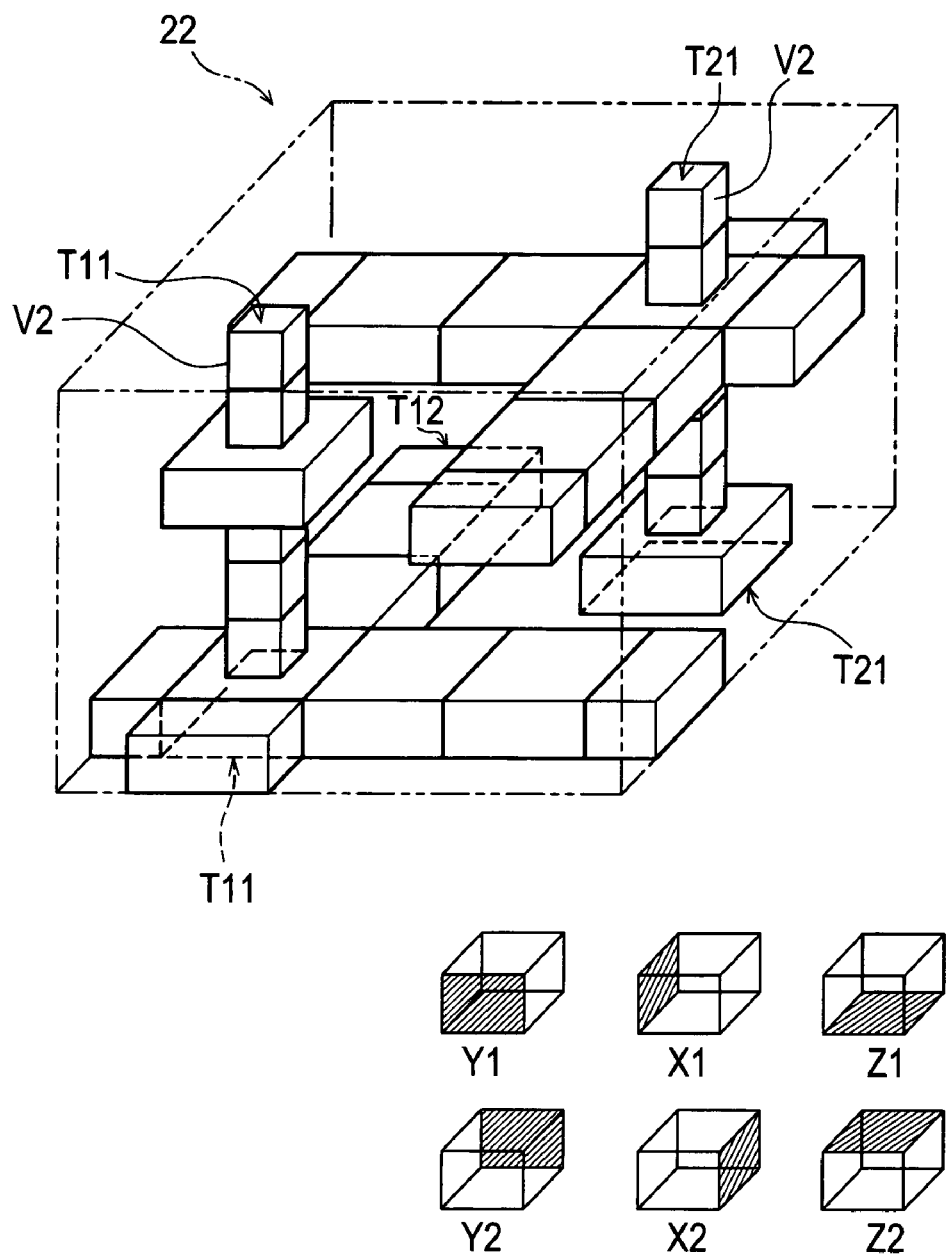
FIG. 9 is a perspective view showing a modification of a capacitance cell.

A capacitance cell 22 shown in FIG. 9 is a modification of the capacitance cell 21. In the capacitance cell 21, the first connection terminals T11 and T21 are connected with the second via contact layers V2 on both upper and lower end faces Z2 and Z1. At this time, the length of the second via contact layers V2 is almost half of the interlayer distance between the wiring layers connected via the second via contact layers V2. Whereas in the capacitance cell 22, the first connection terminals T11 and T21 that are present on any one of the upper and lower end faces Z2 and Z1 are connected with the electrode layer T1 or T2 and via connection layer VCa or VCb in place of the second via contact layers V2. In addition, the length of the second via contact layers V2 connected to the first connection terminals T11 and T21 on the other end face is equal to the interlayer distance between the wiring layers.

When the electrode layer T1 and via contact layer VCa are connected to the first connection terminals T11 and T21 on the lower end face Z1, the capacitance cells 22 can be used as cells in the lowermost tier when forming a capacitance element by linking capacitance cells. A capacitance element using the wiring layer Ma as the lowermost layer can be formed. When the electrode layer T2 and via contact layer VCb are connected to the first connection terminals T21 and T11 on the upper end face Z2, the capacitance cells 22 can be used as cells in the uppermost tier when forming a capacitance element by linking capacitance cells. A capacitance element using the wiring layer Mb as the uppermost layer can be formed.

As has been described in the above in detail, according to a capacitance cell, a semiconductor device, and a capacitance element arranging method, the capacitance cell includes the pair of electrode layers T1 and T2, and the first and second connection terminals T11 and T21 and T12 and T22 connected to the respective electrode layers T1 and T2 are provided on the upper and/or lower end faces Z2 and Z1 and lateral end faces X1, X2, Y1, and Y2 being interfaces between the capacitance cells 21, 22, respectively. Therefore, by linking the capacitance cells 21, 22 with each other, there can be formed a capacitance element of which element size, capacitance value and the like can be increased/decreased in increments of the capacitance cell 21, 22.

By setting the size of the capacitance cell 21, 22 to a size that can be arranged in the non-wired area X remaining after signal wiring, irrespective of the size of the non-wired area X caused by signal wiring and the shapes and the like in the upper and lower and plane directions, the capacitance cells 21, 22 can be linked as necessary to form a capacitance element. A capacitance element can be arranged by making effective use of a vacant area with no signal wiring. It is unnecessary to secure a capacitance wiring area separate from a signal wiring area, which greatly contributes to high integration when arranging a capacitance element.

It should be noted that the present invention is by no means limited to the foregoing embodiment, and as a matter of course, various improvements and modifications can be made to the invention without departing from the scope and spirit thereof.

For example, in the present embodiment, a description has been given of the first connection terminals T11 and T21 and the second connection terminals T12 and T22 as being arranged at identical positions on the opposed end faces, however, the present invention is not limited hereto, and it is also possible to arrange the same at positions different between the opposed end faces. In this case, the capacitance cells can be linked by folding back the same in mirror symmetry.

In addition, with regard to the capacitance cell 21, 22, a description has been given of the case where the electrode layers T1 and T2 are orthogonal within a cell taken as an example, however, the present invention is not limited hereto. When each cell is structured so as to have a pair of wiring layers as a pair of electrode layers and allow, on the respective end faces in the upper and lower direction and the plane direction, connection with the outside for each of the electrode layers, there is no restriction in the shape of layout. For example, it is also possible to arrange the electrode layers T1 and T2 so as to run parallel along one of the lateral end faces with an overlap in the upper and lower direction and arrange the via contact layers side by side on the lateral end face opposed to the lateral end face that runs parallel to the electrode layers T1 and T2.

According to the present invention, it becomes possible to arrange a capacitance element that uses wiring layers sandwiching an interlayer insulating film with less of a leak current as electrodes according to the size of the non-wired area in arrangement.

What is claimed is:

1. A capacitance cell that uses wiring layers laminated in multiple layers as electrodes, comprising:
   a pair of electrode layers formed of a pair of wiring layers adjacently laminated;
   first connection terminals provided on an upper end face and a lower end face that section the cell in an upper and lower direction for each of the electrode layers and extract the electrodes from the electrode layers to outside; and
   second connection terminals provided on four lateral end faces that section the cell in plane directions for each of the electrode layers and extract the electrodes from the electrode layers to outside,
   wherein the capacitance cell is shaped into a parallelepiped each side of which is a unit length.

2. The capacitance cell according to claim 1, wherein the wiring layers forming the electrode layers are metal wiring layers, and longitudinal pathways that interconnect the electrode layers and the first connection terminals include via contact layers.

3. The capacitance cell according to claim 2, wherein among the longitudinal pathways, a pathway located at the side of arrangement of the electrode layer paired with the electrode layer to which the longitudinal pathway is connected comprises:
   a first via contact layer that interconnects the pair of wiring layers; and
   a via connection layer connected to the first via contact layer and formed of the same wiring layer as the paired electrode layer.

4. The capacitance cell according to claim 3, wherein among the longitudinal pathways, a pathway connected to the first connection terminal located on at least any one end face of the upper end face and the lower end face further comprises:
   a second via contact layer that interconnects between the wiring layer forming the electrode layer and the via connection layer and a wiring layer located outside of the first connection terminal.

5. The capacitance cell according to claim 4, wherein when the second via contact layer is provided on both of the upper end face and the lower end face,
   a pathway length of the second via contact layer is almost half as long as an interlayer distance interconnected via the second via contact layer.

6. The capacitance cell according to claim 4, when the second via contact layer is provided on any one of the upper end face and the lower end face,
   the first connection terminal located on one of the upper end face and the lower end face is connected to the second via contact layer, and the first connection terminal located on the other of the upper end face and the lower end face is connected to the electrode layer or the via connection layer.

7. A semiconductor device comprising a capacitance element formed by linking at least two capacitance cells each comprising: a pair of electrode layers formed of a pair of wiring layers adjacently laminated; first connection terminals provided on an upper end face and a lower end face that section the cell in an upper and lower direction for each of the electrode layers and extract the electrodes from the electrode layers to outside; and second connection terminals provided on four lateral end faces that section the cell in plane directions for each of the electrode layers and extract the electrodes from the electrode layers to outside, wherein the capacitance cell is shaped into a parallelepiped each side of which is a unit length, wherein the capacitance cells are linked, in the upper and lower direction, by linking the first connection terminal, and in the plane direction, by linking the second connection terminals, wherein capacitance cells linked in an uppermost tier and a lowermost tier are the capacitance cells according to claim 6, when the capacitance cells are linked in the uppermost tier, the first connection terminal located on the lower end face is connected to the second via contact layer, and the first connection terminal located on the upper end face is connected to the electrode layer or the via connection layer, and when the capacitance cells are linked in the lowermost tier, the first connection terminal located on the upper end face is connected to the second via contact layer, and the first connection terminal located on the lower end face is connected to the electrode layer or the via connection layer.

8. The capacitance cell according to claim 1, wherein the first connection terminals are arranged, when arrangement positions thereof are specified with three-dimensional coordinate, so that a plane coordinate within the upper end face and a plane coordinate within the lower end face have identical coordinates for each of the electrode layers.

9. A semiconductor device comprising a capacitance element formed by linking at least two capacitance cells each comprising: a pair of electrode layers formed of a pair of wiring layers adjacently laminated; first connection terminals provided on an upper end face and a lower end face that section the cell in an upper and lower direction for each of the electrode layers and extract the electrodes from the electrode layers to outside; and second connection terminals provided on four lateral end faces that section the cell in plane directions for each of the electrode layers and extract the electrodes from the electrode layers to outside, wherein the capacitance cell is shaped into a parallelepiped each side of which is a unit length, wherein when the capacitance cells according to claim 8 are linked, the capacitance cells are linked in the same direction while using a distance between the opposed end faces as arrangement pitches when being linked.

10. The capacitance cell according to claim 1, wherein the second connection terminals are arranged, when arrangement positions thereof are specified with three-dimensional coordinate, so that plane coordinates within the opposed lateral end faces have identical coordinates for each of the electrode layers.

11. A semiconductor device comprising a capacitance element formed by linking at least two capacitance cells each comprising: a pair of electrode layers formed of a pair of wiring layers adjacently laminated; first connection terminals provided on an upper end face and a lower end face that section the cell in an upper and lower direction for each of the electrode layers and extract the electrodes from the electrode layers to outside; and second connection terminals provided on four lateral end faces that section the cell in plane directions for each of the electrode layers and extract the electrodes from the electrode layers to outside, wherein the cell is shaped into a parallelepiped each side of which is a unit length, wherein when the capacitance cells according to claim 10 are linked, the capacitance cells are linked in the same direction while using a distance between the opposed end faces as arrangement pitches when being linked.

12. The capacitance cell according to claim 1, wherein each of the electrode layers is formed of one of the pair of wiring layers, and the wiring layer is connected to the second connection terminals located on the four lateral end faces.

13. The capacitance cell according to claim 1 that is laid out by design rules of a maximum one for the wiring layers laminated in multiple layers.

14. A semiconductor device comprising a capacitance element formed by linking at least two capacitance cells each comprising:

a pair of electrode layers formed of a pair of wiring layers adjacently laminated;

first connection terminals provided on an upper end race and a lower end face that section the cell in an upper and lower direction for each of the electrode layers and extract the electrodes from the electrode layers to outside; and second connection terminals provided on four lateral end faces that section the cell in plane directions for each of the electrode layers and extract the electrodes from the electrode layers to outside, wherein the capacitance cell is shaped into a parallelepiped each side of which is a unit length.

15. The semiconductor device according to claim 14, wherein the capacitance cells are linked, in the upper and lower direction, by linking the first connection terminal, and in the plane direction, by linking the second connection terminals.

* * * * *